(12) United States Patent
Van Houdt

(10) Patent No.: US 10,090,036 B2
(45) Date of Patent: Oct. 2, 2018

(54) NON-VOLATILE MEMORY CELL HAVING PINCH-OFF FERROELECTRIC FIELD EFFECT TRANSISTOR

(71) Applicant: IMEC VZW, Leuven (BE)

(72) Inventor: Jan Van Houdt, Bekkevoort (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/385,593

(22) Filed: Dec. 20, 2016

(65) Prior Publication Data
US 2017/0178712 A1 Jun. 22, 2017

(30) Foreign Application Priority Data

Dec. 21, 2015 (EP) ...................................... 15201648

(51) Int. Cl.
*G11C 11/22* (2006.01)
*H01L 27/1159* (2017.01)
*G11C 16/04* (2006.01)

(52) U.S. Cl.
CPC ........ *G11C 11/223* (2013.01); *G11C 11/2273* (2013.01); *G11C 16/0475* (2013.01); *H01L 27/1159* (2013.01)

(58) Field of Classification Search
CPC . G11C 16/0483; G11C 16/0475; G11C 16/26; G11C 16/10; G11C 2216/06; G11C 7/22; G11C 11/223; G11C 7/18; G11C 11/2273

USPC .................. 365/145, 185.05, 185.17, 185.21
See application file for complete search history.

(56) References Cited

U.S. PATENT DOCUMENTS

| | | | |
|---|---|---|---|
| 5,886,920 A | 3/1999 | Marshall et al. | |
| 6,844,770 B2 | 1/2005 | McManus | |
| 6,888,736 B2 | 5/2005 | Dimmler et al. | |
| 7,315,060 B2 * | 1/2008 | Iwata ................. | G11C 16/0475 257/324 |
| 7,315,603 B2 * | 1/2008 | Iwase .................... | B82Y 10/00 257/E21.208 |
| 8,148,759 B2 | 4/2012 | Wilson et al. | |
| 8,867,256 B2 | 10/2014 | Schwartz | |
| 2004/0264257 A1 * | 12/2004 | Hamaguchi ........ | G11C 16/0408 365/210.1 |
| 2005/0280065 A1 * | 12/2005 | Iwata ................. | G11C 16/0475 257/310 |
| 2006/0244070 A1 * | 11/2006 | Iwata ................ | H01L 21/28273 257/355 |

* cited by examiner

*Primary Examiner* — Gene Auduong
(74) *Attorney, Agent, or Firm* — Knobbe, Martens, Olson & Bear LLP

(57) ABSTRACT

The disclosed technology relates generally to non-volatile memory devices, and more particularly to ferroelectric non-volatile memory devices. In one aspect, a non-volatile memory cell includes a pinch-off ferroelectric memory FET and at least one select device electrically connected in series to the pinch-off ferroelectric memory FET.

16 Claims, 4 Drawing Sheets

NON-VOLATILE MEMORY CELL HAVING PINCH-OFF FERROELECTRIC FIELD EFFECT TRANSISTOR

CROSS-REFERENCE TO RELATED APPLICATIONS

This application claims foreign priority to European Patent Application No. 15201648.1, filed Dec. 21, 2015, the content which is incorporated by reference herein in its entirety.

BACKGROUND

Field

The disclosed technology relates generally to nonvolatile memory devices, and more particularly to ferroelectric non-volatile memory devices.

Description of the Related Technology

Some memory devices, e.g., embedded non-volatile memory devices, include floating gate-based devices, which store electrostatic charge in the floating gate. To address scalability issues associated with floating gate-based devices, some embedded non-volatile memory devices include electron trap-based devices, e.g., polysilicon-oxide-nitride-oxide-silicon (SONOS) devices, which store electrostatic charges in the gate stack, e.g., in the oxide-nitride-oxide, instead of a floating gate. For both types of devices, the reading operation is performed by sensing the current trough a channel, which is modulated by the stored charge.

Injecting charge into and from a floating gate or a charge trapping layer (e.g., the nitride layer in SONOS devices, which is electrically insulating) may be performed under relatively high voltages (e.g., between 10V and 20V). The high voltage operations programming (e.g., write and erase) operations may be undesirable, especially embedded memory applications, because the relatively high voltages are usually provided by high voltage circuitry, e.g., large charge pumping circuits, which may be integrated on-chip, and include large high voltage transistors. In addition, writing and erasing are much slower than reading in floating gate-based or charge trapping layer-based devices. Moreover, building-in a charge pump on-chip adds a substantial number of processing steps, which renders embedded non-volatile memory a very high-cost memory solution. For these reasons, the use of embedded non-volatile memory devices has been limited to applications where the added cost and/or process/design complexity are outweighed by the need, e.g., in security, smart cards, automotive microcontrollers, among other applications.

Another non-volatile memory which has attracted great attention from the relevant industry as a good candidate for both memory and switching applications is the ferroelectric field-effect transistor (FeFET) memory. Some FeFET memory devices resemble a standard metal-oxide-semiconductor FET (MOSFET). Unlike a standard MOSFET, however, the gate oxide dielectric is replaced by a ferroelectric material for a FeFET memory device. By modulating the gate electrode, e.g. for n-MOS by applying a positive ($V_{cc}$) or negative voltage ($-V_{cc}$) inversion or accumulation, respectively, of the channel occurs at the ferroelectric-semiconductor (channel) interface, while writing/erasing and thereby switching the FeFET on ("1" state) or off ("0" state). As the gate voltage is released, the device remains in its state. These states correspond to the so-called remnant polarization states +Pr and −Pr, respectively. The bistable state of a ferroelectric can thus be programmed as binary information ("1" or "0"). This is due to the displacement of charges which is inherent to the crystal structure of the ferroelectric material and does not disappear in the absence of the electric field or gate voltage applied. Without being bound to any theory, these considerations render ferroelectric materials suitable for use in low-power non-volatile memories that use lower program/erase voltages (typically +/−4V). In addition, these low program/erase voltages are obtained while having similar or better performance metrics compared to floating gate-based or charge trapping layer-based memories, e.g., faster writing and erasing times.

However, the adoption of the FeFET has been substantially hampered for several reasons. Some of these reasons were addressed when the ferroelectric phase in doped orthorhombic $HfO_2$ was discovered. However, due to yjr presence of a depolarization field, which is due to the low permittivity of the silicon channel (about 12), there can be a non-zero electric field that is applied to materials in contact with the ferroelectric material even under the retention condition when no voltage is applied. As a consequence, there may also be a corresponding electric field over the ferroelectric material which is persistent and opposite to the polarization (by Gauss' law). The resulting induced electric field can disadvantageously work against the polarization and hence depolarize the cell, which can result in a gradual erasure of a cell that has been programmed. Therefore, there is a need for novel and improved FeFET memory devices that address these and other limitations of FeFETs.

One way to remove this depolarization field is to use a pinch-off ferroelectric memory cell, e.g., a pinch-off ferroelectric FET. The pinch-off FET comprises a relatively highly doped n-type semiconductor channel on a n-type substrate, which will remain in accumulation mode even in the retention condition when no voltage is applied. In other words, the pinch-off FET is normally in a switched-on (state "1") state without an external voltage. According to embodiments of the disclosed technology the channel length and/or doping used may be chosen such that the device can be pinch-off properly and provides the desired pinch-off voltage. However, when reading the cell state, i.e. the stored "1" or "0" data, from such a pinch-off ferroelectric FET, a negative gate bias (=read voltage) needs to be applied to the gate electrode in order to modulate the current and distinguish between a "1" and a "0" state. In a classical read-out scheme, this read voltage is placed between the two threshold voltage levels (programmed and erased), in order to have a current in one state and no current in the other one. In a pinch-off ferroelectric FET, however, such a scheme would correspond to a depleted state and an accumulation state. The depleted state would again introduce a depolarization field which again will cause the cell to lose its charge when reading it for a prolonged period of time.

SUMMARY OF CERTAIN INVENTIVE ASPECTS

It is an object of embodiments of the disclosed technology to provide good pinch-off ferroelectric memory cells and fabrication methods thereof. With good ferroelectric pinch-off memory cells is meant ferroelectric memory cells having good non-volatile properties, e.g. long retention times.

The above objective is accomplished by a method and device according to embodiments of the disclosed technology.

In a first aspect, the disclosed technology provides a non-volatile memory cell, comprising a pinch-off ferroelectric FET and at least one select device electrically connected in series to the pinch-off ferroelectric FET.

It is an advantage of embodiments of the invention that the FeFET memory device electrically connected in series with a select transistor has excellent retention characteristics. The pinch-off ferroelectric FET and the at least one select device may for instance be planar devices or 3D devices (e.g. finFET).

A pinch-off ferroelectric FET" is a depletion device, for instance an n-channel device that needs negative gate bias in order to be cut off, hence a device with a negative threshold voltage. As a result, contrary to common ferroelectric FETs, a pinch-off ferroelectric FET as referred to in embodiments of the disclosed technology operates in two distinct accumulation modes, whereby the difference in current between both accumulation modes defines a window between the "0" and "1" state.

It is an advantage of embodiments of the invention that by reading the ferroelectric pinch-off memory cells in accumulation there is no field across the ferroelectric layer in read mode, therefore avoiding read disturb due to the depolarization field.

It is an advantage of embodiments of the invention that the appearance of a voltage drop over the stack is avoided whereby the depolarization field is brought back to zero ("is killed").

It is an advantage of embodiments of the invention that the depolarization field is removed both under retention as well as under the read condition.

It is an advantage of embodiments of the invention that the depolarization field is suppressed by design. Since a pinch-off FeFET is used in series with a select device, e.g. a conventional enhancement transistor, there is hardly any voltage drop over it and consequently also no field will appear across the ferroelectric layer, and as a result good retention is obtained.

It is an advantage of embodiments of the invention that, since a pinch-off FeFET is used in series with a select device, e.g. a select transistor, the select transistor enables to cut off the current in non-selected cells in an array, which is required since all memory transistors are always in the on state.

It is an advantage of embodiments of the invention that using a select device, e.g. a select transistor, in series with a pinch-off FeFET enables to select a bit by applying a select gate voltage. This way, the gate voltage on the memory cell can be kept at zero during read mode in order to have no depolarization field over the ferroelectric layer at any time.

It is an advantage of embodiments of the invention that information leakage is restricted to a minimum.

It is an advantage of embodiments of the invention that alternatives are provided for 2T floating gate or SONOS embedded memory non-volatile devices with lower program/erase voltages, faster programming times, and, moreover, without the typical drawbacks of depolarization fields in ferroelectric non-volatile memory devices.

In a non-volatile memory cell according to embodiments of the disclosed technology, the at least one select device may be at least one select transistor. This reduces complexity of the manufacturing process. It is an advantage of embodiments of the disclosed technology that no major changes are needed to the materials bill or to the process integration (e.g. no necessity of new tooling). As a result, embodiments of the disclosed technology provide low cost concepts (compared to other embedded non-volatile devices) which are efficient and can be used as low power-consumption storage devices.

It is an advantage of embodiments of the invention that ferroelectric memory cells are used, which are charge based, resulting in a device which is extremely low power having a small periphery.

In one aspect, a non-volatile memory cell includes a pinch-off ferroelectric FET and at least one select device electrically connected in series to the pinch-off ferroelectric FET. In some embodiments, the pinch-off ferroelectric FET has a channel layer electrically connecting a source and a drain, where each of the channel layer, the source and the drain is formed of a semiconductor region doped with a first dopant type, such that the pinch-off ferroelectric FET is a normally on FET without having a gate bias applied to the pinch-off FET. When the at least one select device comprises a select transistor, the select transistor has a channel layer formed of a semiconductor region doped with a second dopant type opposite the first dopant type, where the channel layer of the select transistor electrically connects a source and a drain each doped with the first dopant type, where the drain of the select transistor serves as the source of the pinch-off ferroelectric FET. In some embodiments, the drain of the select transistor serves as the source of the pinch-off ferroelectric FET is electrically floating without having an external electrical connection.

In a non-volatile memory cell according to embodiments of the disclosed technology, the pinch-off ferroelectric FET may comprise a ferroelectric gate stack comprising at least one ferroelectric layer, with on top thereof a gate electrode; a source region and a drain region; and an n-type channel layer. The source region and drain region are electrically connected to the n-type channel layer. The pinch-off ferroelectric FET has a negative threshold voltage, and the at least one select transistor is an n-MOS gate stack comprising a select gate electrode. In a non-volatile memory cell according to embodiments of the disclosed technology, the source and drain regions may be provided by highly doped n+ regions.

Also the source and drain regions of the at least one select device may be provided by highly doped n+ regions. In particular embodiments, the drain region of the select device may act as a source region of the pinch-off ferroelectric FET. Alternatively, the source region of the select device may act as a drain region of the pinch-off ferroelectric FET.

A non-volatile memory cell according to embodiments of the disclosed technology may further comprise at least one dielectric layer between the at least one ferroelectric layer and the n-type channel and/or between the at least one ferroelectric layer and the gate electrode.

In a non-volatile memory cell according to embodiments of the disclosed technology, the n-type channel may be formed by counter-doping a p-type substrate provided under the pinch-off ferroelectric FET. Alternatively, the n-type channel layer may be provided in an n-type region under the pinch-off ferroelectric FET, whereby the n-type region may be provided on a p-type substrate or an insulator.

In a non-volatile memory cell according to embodiments of the disclosed technology, the at least select one select device and the pinch-off ferroelectric FET may be electrically connected in series between a bit line and an array ground. In embodiments of the disclosed technology, the pinch-off ferroelectric FET may be positioned at the bit line side and the select device may be positioned at the side of the array ground. Alternatively, the pinch-off ferroelectric FET may be positioned at the side of the array ground and the select device may be positioned at the bit line side.

Embodiments of the disclosed technology advantageously may be used as a low-voltage alternative for non-volatile concepts on the market, like for example Electrically Erasable Programmable Read-Only Memory (EEPROM), resistive random-access memory (RRAM) and phase-change memory devices (PCM) and spin-transfer torque (STT) devices.

In a second aspect, the disclosed technology provides a non-volatile memory array, comprising a plurality of memory cells according to embodiments of the first aspect, logically arranged in rows and columns.

In a further aspect, the disclosed technology provides a method of operation of a non-volatile memory device according to embodiments of the first aspect, wherein data of the ferroelectric pinch-off memory gate stack in accumulation mode is read out without applying a voltage to the gate electrode of the ferroelectric pinch-off memory FET.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
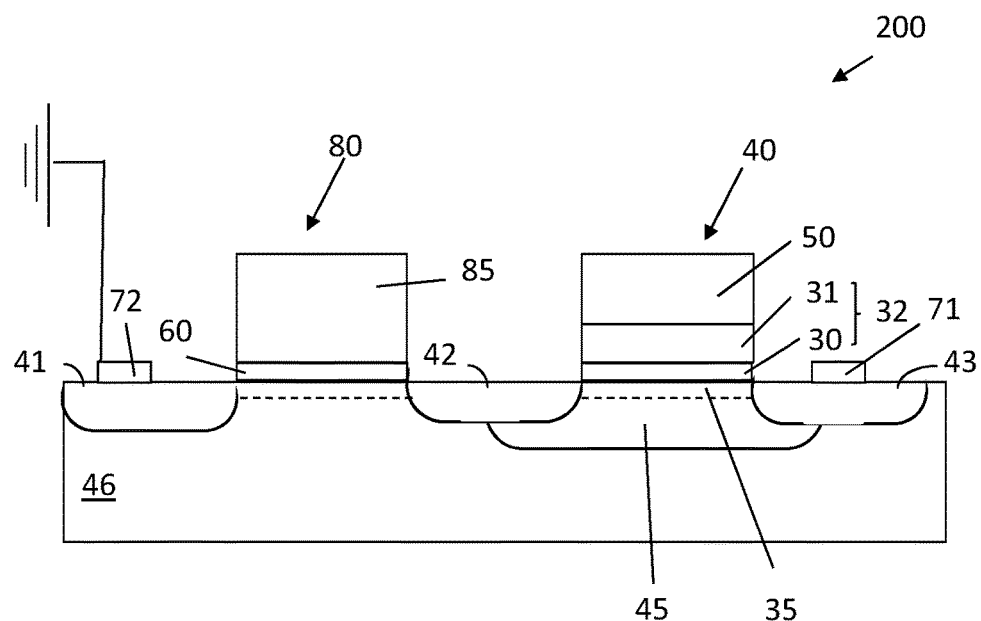
FIG. 1 schematically illustrates a cross-sectional view of a pinch-off FeFET electrically connected in series with a select transistor to form a ferroelectric pinch-off memory cell, according to embodiments.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this invention, in one or more embodiments.

Similarly it should be appreciated that in the description of exemplary embodiments of the invention, various features of the invention are sometimes grouped together in a single embodiment, figure, or description thereof for the purpose of streamlining the invention and aiding in the understanding of one or more of the various inventive aspects. This method of invention, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the disclosed technology reference is made to "a pinch-off ferroelectric FET", reference is made to a depletion device, like for example an n-channel ferroelectric FET of which the n-type channel is provided in an n-type substrate (which may be an n-type layer on, typically, p-type substrate, or on an insulator like an oxide, e.g. in the case of SOI technology), whereby a ferroelectric gate dielectric may be provided on top of the n-channel. When referring to a depletion device one may refer to an n-channel device that needs negative gate bias in order to be cut off, hence a device with a negative threshold voltage. As a result, contrary to common ferroelectric FETs, a pinch-off ferroelectric FET as referred to in embodiments of the disclosed technology operates in two distinct accumulation modes, whereby the difference in current between both accumulation modes defines a window between the "0" and "1" state. In embodiments of the disclosed technology a pinch-off FeFET is preferably biased between the edge of the accumulation state (e.g. close to depletion state) and the 'deep accumulation' state in order to have an appreciable window. For avoidance of doubt it is clarified that it is not the intention of the disclosed technology to use ferroelectric FETs in the actual pinched-off mode.

Where in embodiments of the disclosed technology reference is made to a "substrate" reference is made to an object or layer or stack of layers onto which a layer of interest is applied.

Embodiments of the disclosed technology provide an array of memory cells logically organized in rows and columns. The terms "horizontal" and "vertical" (related to the terms "row" and "column" respectively) may be used to provide a co-ordinate system, for ease of explanation only. They do not need to, but may, refer to an actual physical direction of the device. The terms "column" and "row" may be used to describe sets of array elements which are linked together. The linking of the memory cells in the array can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly, the terms "row" and "column" should be interpreted widely. To facilitate in this wide interpretation, the claims refer to memory cells being logically organized in rows and columns. By this is meant that sets of memory cells are linked together in a topologically linear intersecting manner; however, that the physical or topographical arrangement need not be so. For example, the rows may be circles and the columns radii of these circles and the circles and radii are described in this invention as "logically organized" rows and columns. Also, specific names of the various lines, e.g. select line, bit line, word line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

A ferroelectric (FeFET) memory device includes a ferroelectric layer, such as for instance lead zirconium titanate (PZT), for storing data. By applying an external field, e.g., a gate voltage, to the gate electrode, accumulation or depletion of the majority carries occur at the interface between the ferroelectric layer and the semiconducting channel, which in turn induces a polarization of the ferroelectric layer, thereby turning the device on ("1" state) or off ("0" state). As the gate voltage is released, the device retains its state. These states correspond to the so-called remnant polarization +Pr and −Pr, respectively. The bistable state of a ferroelectric can thus be programmed as binary information ("1" or "0"). Without being bound to any theory, this may be due to the displacement of charges, which may be inherent to the crystal structure of the ferroelectric material, that does not disappear in the absence of the electric field or gate voltage applied. This is why ferroelectric materials are very suitable for use in low-power non-volatile memories. In addition, the direction of the polarization P can be reversed or reoriented by applying an appropriate electric field (gate voltage).

Some prior art ferroelectric memory devices do not have the desired long-term non-volatility. The information leaking away is due to a depolarization field being present, which is finite due to the finite permittivity of the semiconducting channel. Since Si has a low permittivity of about 12, and most ferroelectric materials have high permittivity values, this leakage may occur in ferroelectric memory devices that use silicon as a channel material. This may be one of the reasons why ferroelectric memory devices have not made it into the market place so far.

Compared to conventional inversion mode FeFETs, the use of n-doped devices working in accumulation mode, or a so called pinch-off ferroelectric (FeFET) memory device, advantageously can remove this depolarization field since the channel may be a relatively highly doped n-type semiconducting channel which remains in accumulation during zero voltage or retention conditions. However, when reading the pinch-off FeFET cell, a negative gate bias is typically applied in order to modulate the current and distinguish between a "1" state and a "0" state. In a classical read-out scheme, this read voltage is placed between the two threshold voltage levels ($V_t$) (programmed and erased), in order to have a current in one state and less or no current in the other one. In a pinch-off FeFET, such a scheme would, however, correspond to a depleted state and an accumulation state respectively. Unfortunately, the depleted state (which would be enabled when applying the highest threshold voltage ($V_t$) which is known as the pinch-off voltage ($V_{po}$)) would again introduce a depolarization field which again will cause the cell to lose its charge and thus its non-volatile behavior when reading it for a prolonged period of time.

Figure 2:
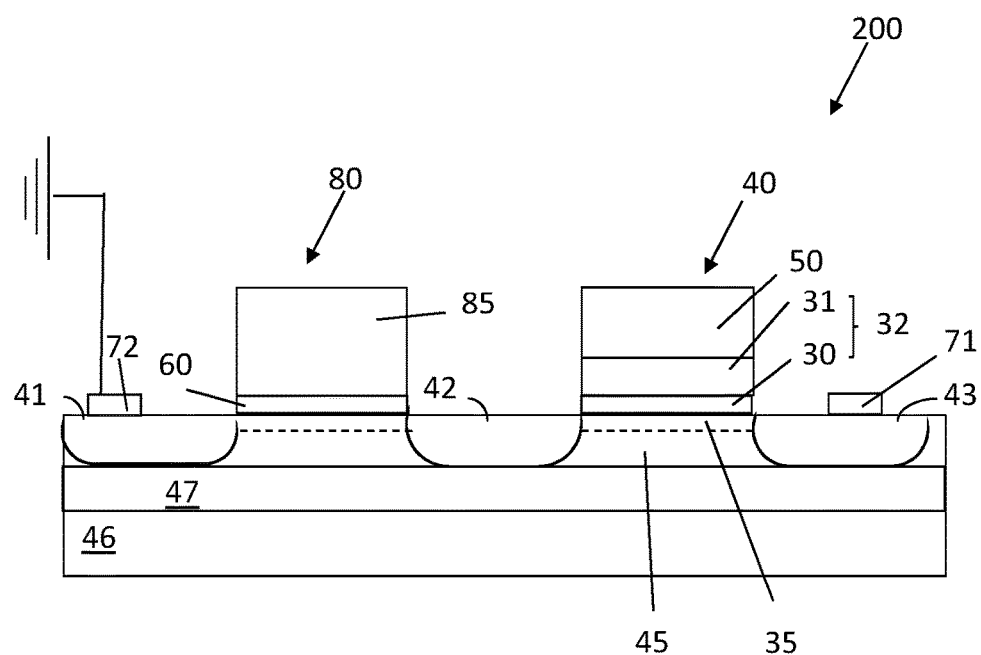
FIG. 2 schematically illustrates a cross-sectional view of an alternative pinch-off FeFET electrically connected in series with a select transistor to form a ferroelectric pinch-off memory cell, according to embodiments.

To solve this problem, in a first aspect, embodiments of the disclosed technology provide a ferroelectric pinch-off memory stack electrically connected in series to a select device such as a select transistor, as schematically illustrated for different embodiments in FIG. 1 and FIG. 2. It is an advantage of embodiments of the disclosed technology that, by putting a select device, e.g., a select transistor, electrically in series with a pinch-off ferroelectric memory cell, the ferroelectric pinch-off memory cell is kept conductive. In addition, by reading the ferroelectric pinch-off memory cell at zero gate voltage, the ferroelectric pinch-off memory cell is not placed under a depletion condition, and therefore the memory cell does not lose its charge of non-volatile behavior. According to embodiments of the disclosed technology, the select device, e.g. select transistor, and the ferroelectric pinch-off memory element are electrically connected in series between a bit line and an array ground, whereby the ferroelectric pinch-off memory cell may be positioned at the bit line side or source line side. According to particular embodiments, the select device may be positioned at the bit line side in order to disconnect the ferroelectric pinch-off memory element from the bit line voltage. Preferably, a drive electrode of the select device, e.g., the gate of the select transistor, is connected to a wordline. The select device is present in embodiments of the disclosed technology, since the gate of the memory element is not used to select a particular bit on a wordline. In addition, by using a select device, electrically connected in series with a ferroelectric pinch-off memory cell, the select device advantageously enables to cut off the current in non-selected cells, since the ferroelectric pinch-off memory element is always in the on state. The select device moreover may have a second function: to select the bit by applying a select gate voltage. This way, the gate voltage on the cell can be kept at 0 V during read, in order to have no depolarization field over the ferroelectric layer at any time.

According to embodiments of the disclosed technology, when the state of the pinch-off ferroelectric memory cell is to be read, the select transistor is turned on via a voltage ($V_{cc}$) applied to wordline, and a read voltage ($V_{cc}$) is applied to bit line to determine the conductive state of ferroelectric pinch-off memory cell. And thus when reading, advantageously there is zero voltage applied on the ferroelectric pinch-off memory element and there is no depolarization field over the ferroelectric layer and the gate of the ferroelectric pinch-off memory element is no longer used to select a particular bit on a wordline. According to embodiments of the disclosed technology the signal of the sense amplifier may be a current difference between a programmed and erased state of a ferroelectric pinch-off memory cell in accumulation mode, which is indicative of the charge that was released by the ferroelectric pinch-off memory cell. Therefore, according to embodiments of the disclosed technology, the difference between these two on states defines the bit of the ferroelectric pinch-off memory cell. Advantageously, by using the difference, the field across the stack of the memory cell is removed while reading therefore avoiding read disturb due to a depolarization field. The memory cell is programmed or erased by applying an appropriate voltage between memory element control gate and bit line, with the select device turned off, e.g. zero volt being applied to the gate of the select transistor. TABLE I provides an operating table with typical values of operating voltages for programming (write), erasing and reading a ferroelectric pinch-off memory element electrically connected in series with a select transistor according to embodiments of the disclosed technology.

TABLE I

Operating table of a ferroelectric pinch-off memory cell connected in series with a select transistor according to embodiments of the disclosed technology

| Operating table | Select gate | Cell gate | Source | Drain |
|---|---|---|---|---|
| Write select/deselect | 0 | 4 V/4 V | 0 | 0/4 V |
| Page erase | 0 | −4 V | 0 | 0 |
| Read | $V_{cc}$ | 0 | 0 | $V_{cc}$ |

Since sense amplifiers typically flip based on absolute and not based on relative current levels, this does not necessarily imply a lower read speed and the cell with presented read out scheme in Table I can also be used in read intensive NOR applications without any risk for read disturb.

In an exemplary embodiment, like for example illustrated in FIGS. 1 and 2, a ferroelectric pinch-off memory FET 40 comprises a source region 42, a drain region 43 and a ferroelectric gate stack 32 over an n-type channel layer, whereby the n-type channel 35 layer may be provided in an n-type substrate or an n-type substrate region 45. The p-type substrate or the n-type substrate region 45 may be generated in a p-type substrate 46 by counter-doping (FIG. 1) or, alternatively, when SOI technology is employed the n-type substrate or the n-type substrate region 45 is provided on an insulating layer, e.g., a buried oxide 47 which separates the n-type substrate or the n-type substrate region 45 from the p-type substrate 46, as illustrated in FIG. 2. In embodiments, as illustrated in FIG. 1, where an n-type channel 35 in an n-type substrate or an n-type substrate region 45 is provided in a p-type substrate 46 by, for example, counter-doping, the p-type substrate 46 also serves as a substrate of the select device 80, resulting in an n-type MOS transistor as a select device 80. The source region 42 and the drain region 43 are electrically coupled to either side of the n-type channel layer. At least one dielectric layer 30 may be present between the ferroelectric gate region and the n-type channel and/or between the ferroelectric gate region and a gate electrode.

In the illustrated embodiment, a non-volatile memory cell 200 comprises a pinch off ferroelectric memory FET 40 connected in series with a select device 80. The ferroelectric memory FET 40 comprises a gate electrode 50 such as a metal gate electrode, e.g., a few nm of TiN, on top of a ferroelectric gate stack 32. The ferroelectric gate stack 32 comprises one or more ferroelectric layers 31, for instance a 5 nm Al-doped $HfO_2$ in orthorhombic phase. Optionally, at least one dielectric layer 30, for instance a $SiO_2$ layer or a few nm's of Hf—Al—O, may be included between the one or more ferroelectric layers 31 and an n-type semiconductor channel 35. The ferroelectric gate stack 32 is provided on top of the n-type semiconductor channel layer 35. The n-type semiconductor channel layer 35 is configured such that the pinch off ferroelectric memory FET 40 is configured to receive a negative gate bias in order to cut-off, or pinch-off, the channel of the ferroelectric memory FET 40 having a negative threshold voltage. The latter can be accomplished by counterdoping with an n-type or donor element (e.g. As or P) in a conventional n-type MOS process. The gate electrode 50 is provided on top of the ferroelectric layers 31 and the n-type semiconductor channel 35 is provided on or in an n-type substrate or an n-type substrate region 45, for instance an n− implanted substrate region 45 formed in a p-type substrate 46, as illustrated in FIG. 1. Highly doped n+ junctions are provided as source and drain regions, for example as source and drain regions 41, 42 of the select device 80 or as source and drain regions 42, 43 of the ferroelectric memory FET 40 in electrical contact with the n-type semiconductor channel 35, whereby the drain region 42 of the select device serves as a source region 42 of the a pinch off ferroelectric memory FET 40. A source line electrode 72 and a bit line electrode 71 may in addition be provided on top of and in electrical contact with the source region 41 of the select transistor and the drain region 43 of the pinch off ferroelectric memory FET 40, respectively. The drain electrode 71 serves as, or is electrically connected to, a bit line when programming or erasing the memory cell. As illustrated in FIGS. 1 and 2, since region 42 is an internal node, there is no need to electrically contact this region. In alternative embodiments, for example in conventional NOR arrays, area savings may be realized by only contacting the bit line electrode 71 while the source line electrode 72 is a buried diffusion layer (like for example illustrated in FIG. 3 further on).

The at least one select device 80, for instance in the embodiment illustrated a select transistor, may be an n-type MOS stack comprising a select gate electrode 85 on top of a gate dielectric layer 60. Also the select device 80 may have highly doped n+ junctions as source and drain regions 41, 42. In embodiments of the disclosed technology, the pinch-off ferroelectric memory FET 40 is an electronic component which is separate from the select transistor 80. In embodiments of the disclosed technology, the drain region 42 of the select transistor 80 may coincide with the source region 42 of the ferroelectric memory FET 40. Alternatively, in embodiments which are not illustrated, the source region of the select transistor 80 may coincide with the drain region of the ferroelectric memory FET 40.

Figure 4:
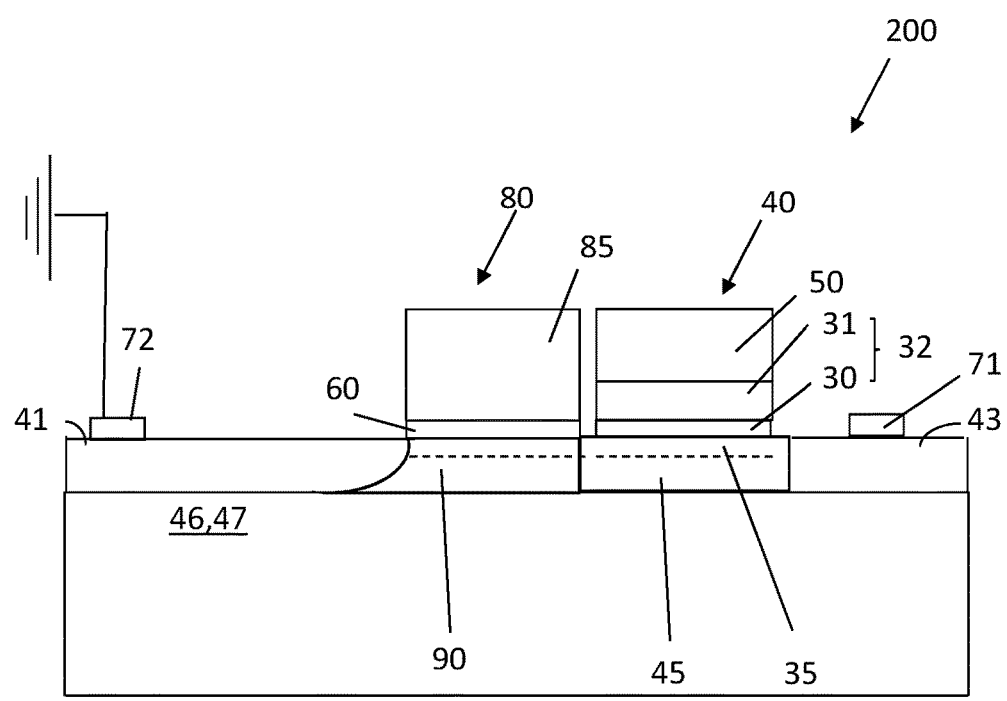
FIG. 4 schematically illustrates a cross-sectional view of an alternative embodiment of a pinch-off FeFET electrically connected in series with a select transistor to form a ferroelectric pinch-off memory cell, according to embodiments.

In alternative embodiments, the highly doped n+ junction 42 serving as drain region for the select device and as source region for the pinch-off memory device may be removed resulting in a more compact device. FIG. 4 illustrates such an alternative embodiment, whereby a select device 80 is connected in series with the pinch-off ferroelectric memory FET 40 with no internal n+ junction 42 present, whereby the select device 80 may be a regular or n-type MOS stack comprising a doped gate dielectric layer (e.g. $HfO_2$) 60 resulting in an n-type MOS having anti-ferroelectric behavior. The select device 80 may comprise a select gate electrode 85 on top of a gate dielectric layer 60. The select device 80 may have a highly doped n+ junction as source region 41, whereby the select device 80 is provided on a p-type region 90. The pinch-off ferroelectric memory FET 40 comprises an n-type channel 35 provided in an n-type substrate 45. The p-type region 90 under the select device 80 may be provided by first providing a common n-type layer under the select device 80 and pinch-off ferroelectric memory FET 40, which thus would function as the n-type substrate 45 and thereafter defining a p-type region 90 by selective counterdoping.

Figure 5:
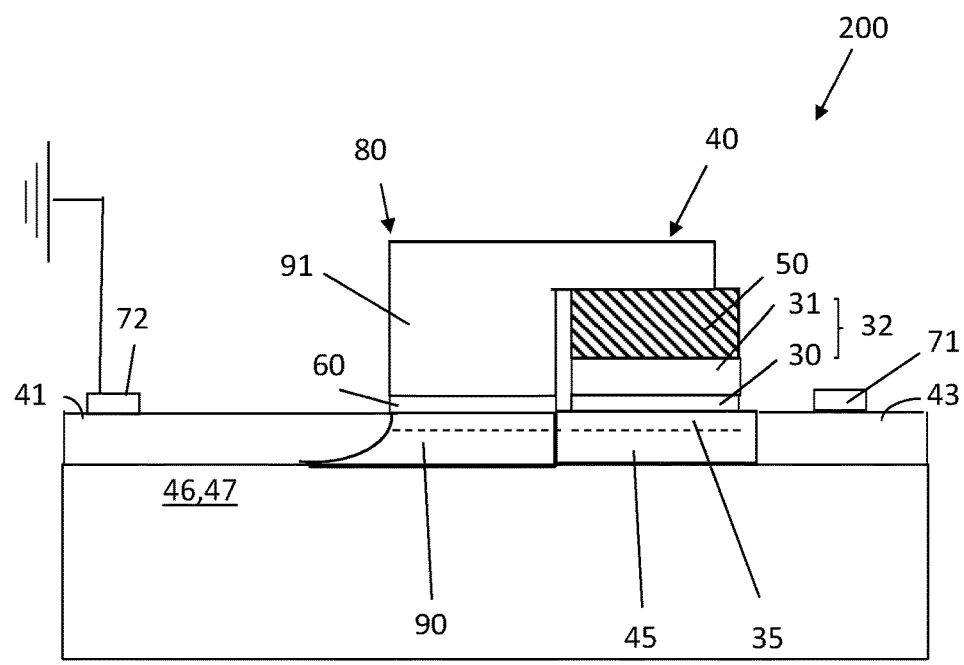
FIG. 5 schematically illustrates a split gate version of the embodiment illustrated in FIG. 4.

The p-type region 90 and n-type substrate 45, of respectively the select device 80 and pinch-off ferroelectric FET 40, may be provided on a common substrate, for example an oxide 47 or p-type substrate 46. The p-type region of the select device may act as a source region for the pinch-off ferroelectric FET and a highly doped n+ junction 43 may be provided as drain region. A source line electrode 72 and a bit line electrode 71 may in addition be provided on top of and in electrical contact with the source region 41 of the select transistor and the drain region 43 of the pinch off ferroelectric memory FET region, respectively. In yet alternative embodiments, a split gate version of the device according to the embodiment illustrated in FIG. 4 is provided in FIG. 5. A select gate electrode 91 is provided such that it overlaps and covers the gate electrode of the pinch-off ferroelectric FET 50 and acts as the gate electrode of the select transistor 80. As the select gate electrode 91 overlaps the gate electrode 50 of the pinch-off ferroelectric FET 40 a self-aligned memory cell is enabled. The select gate electrode 91 may be a second or top poly-Si gate serving as a word line (poly 2) and the gate electrode of the pinch-off ferroelectric FET 50 may be a first or lower poly-Si serving as the gate electrode (poly 1). For the avoidance of doubt, no floating gate construction is present in this embodiment. As a result, in this embodiment, both electrodes 50, 91 are contacted, wherein poly 2 91 is contacted with the select gate or word line, and poly 1 50 is contacted with the plate line. By design, the split gate version of the memory cell according to embodiments of the disclosed technology advantageously eliminates the stacked gate issue of "over-erase", by isolating each memory cell from the bit line.

In embodiments of the disclosed technology the select transistors 80 differ from the ferroelectric pinch-off memory stacks 40 in that they are conventional MOSFETs. The select transistors 80 are switching elements rather than memory elements. The ferroelectric pinch-off memory cells 200 according to embodiments of the disclosed technology, e.g. the at least one select device 80 and the ferroelectric memory FET 40, are illustrated as devices with planar geometries, which are formed by depositing semiconductor layers. However, embodiments of the disclosed technology are not limited to planar geometries, as a person skilled in the art could easily translate the teaching of embodiments of the disclosed technology in 3D structures, like for example using FinFET flow. FinFETs are 3D structures that rise above the substrate and resemble a fin, whereby the 'fins' form the source, channel and drain, effectively providing more volume than a planar transistor for the same area. The gate wraps around the fin, providing better control of the channel and allowing very little current to leak through the body when the device is in the 'off' state. This, in turn, enables the use of lower threshold voltages and results in better performance and power.

The semiconductor substrate used in embodiments of the disclosed technology is not specifically limited so long as it may be used for a semiconductor device. The substrate may be, for example, bulk substrates of elemental semiconductors of silicon, germanium and so on and compound semiconductors of silicon germanium, GaAs, InGaAs, ZnSe, GaN and so on. Moreover, it is acceptable to employ multilayer substrates such as an SOI (Silicon on Insulator) substrate, an SOS (Silicon on Sapphire) substrate or ceramics, glass or plastic substrate on top of which a semiconductor layer is processed. Among others, a silicon substrate or an SOI substrate on the surface of which a silicon layer is formed are preferred. The semiconductor substrate or the semiconductor layer may be single crystal (by, for example, epitaxial growth), polycrystalline or amorphous although there may be variations in the quantity of current flowing inside.

In embodiments of the disclosed technology, optionally, isolation regions may be formed in the semiconductor substrate. In one embodiment, as illustrated in FIG. 2, active areas of the semiconductor devices of the disclosed technology may be isolated from the underlying substrate. A corresponding isolation region 47 may be provided by a buried oxide (BOX) layer or other layers of dielectric material. In the same or alternative embodiments (not illustrated in the drawings), shallow trench isolation (STI) areas may separate adjacent pairs of transistors. Formation of the buried oxide layer and areas of shallow trench isolation is well known in the art, and need not be explained in more detail here.

It is, however, essential that materials used as semiconductor substrate enable the formation of a pinch-off ferroelectric memory FET 40 comprising an n-type channel 35 on an n-type substrate or in an n-type region 45. In an exemplary embodiment, when a n-type channel 35 is provided and a p-type wafer 46, then one may locally provide an n-type region 45 under the n-type channel in or on the p-type substrate, such as to enable provision of a pinch-off ferroelectric FET which modulates current in accumulation. In embodiments of the disclosed technology such pinch-off behavior can be accomplished by counterdoping a p-type well or substrate such that an n-type channel is generated in an n-type region, whereby the p-type is provided as a substrate under the select transistor and pinch-off ferroelectric FET.

Since $HfO_2$ is typically used as gate dielectric in CMOS, a ferroelectric layer as gate dielectric in the embedded memory cell would yield very compatible processing with the baseline CMOS. If then also a doped $HfO_2$ layer would be used for the CMOS (to enable anti-ferroelectric behavior) it would still be quite compatible, whereby on top of that a steeper subthreshold slope would be obtained for the CMOS.

Figure 3:
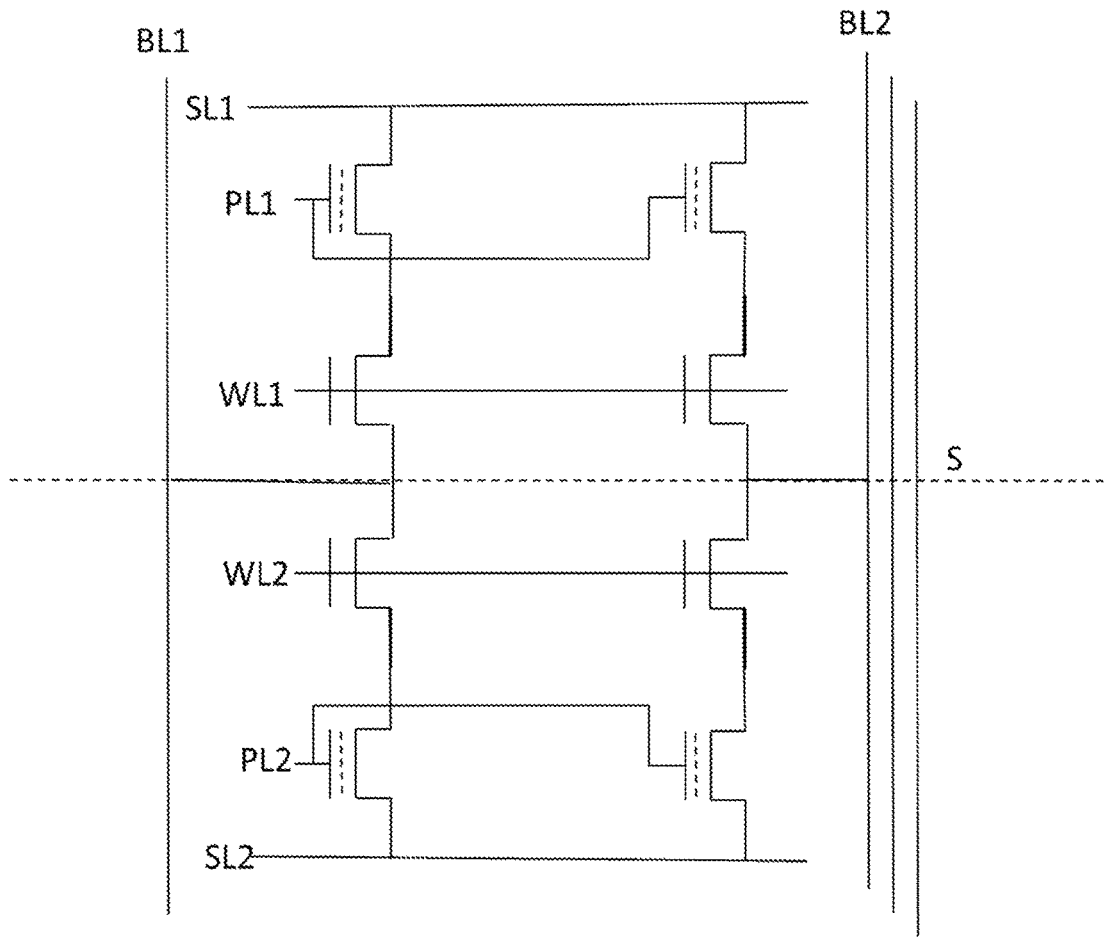
FIG. 3 illustrates an equivalent circuit of a pinch-off FeFET cell array, according to embodiments.

According to embodiments of the disclosed technology, a pinch-off ferroelectric memory cell array may be provided, comprising a plurality of pinch-off ferroelectric memory cells 200, each comprising a ferroelectric memory FET 40 and a select device 80, e.g. a select transistor. Operations (erase, program and read) of the pinch-off memory cell array may be enabled by providing a plurality of word lines, source lines and bit lines as illustrated in FIG. 3. FIG. 3 illustrates a NOR array according to embodiments of the disclosed technology. The memory cells can be arranged in rows and columns to form a memory array with source lines (SL1, SL2) coupled to a source of each non-volatile memory cell located in a given column; and a bit lines (B1, B2) coupled to a drain of each access or select transistor of the non-volatile memory cells in a given row. The drive electrode of the select device, e.g. the gate of the select transistor, is connected to a wordline (WL1, WL2). The main function of the select device is to be able to cut the current in non-selected cells (since all memory transistors are always in the on state). More specifically, the select device is provided to cut the current of the non-selected cells on the same column to enable proper read out. In order not to program or erase these non-selected cells on the same row, an inhibit voltage is preferably applied to their bit lines to reduce the potential drop over the gate dielectric of the memory transistors (e.g. ferroelectric memory FETs), similar to the case of the 2T SRAM cell. The array of FIG. 3 also comprises plate lines (PL1, PL2) for driving one gate of the ferroelectric transistor of the non-volatile memory cell.

The non-volatile memory cells can be located in a common n-region and/or a common n-doped layer. In embodiments of the disclosed technology the cells may be mirrored around a symmetry axis S and around the source line, such that advantageously only half the typical contact area is needed per cell, resulting in a more compact device.

In a further aspect, the disclosed technology relates to a method of manufacturing a non-volatile memory cell 200 according to embodiments of the disclosed technology. The method comprises providing a pinch-off ferroelectric memory FET 40 and providing at least a select device, for instance a select transistor 80. The pinch-off ferroelectric memory FET 40 and the select device, e.g. select transistor 80, are electrically connected in series.

The materials used in the method according to embodiments of the disclosed technology may be as set out above, in embodiments of earlier-described aspects of the invention.

In an exemplary embodiment the pinch-off FeFET of the disclosed technology may be fabricated on a p-type semiconductor wafer, for instance a p-type silicon wafer 46. As complete isolation of the active areas from the underlying silicon substrate 46 may be preferred, a buried oxide layer (BOX) 47 may be provided in the wafer 46, as illustrated in FIG. 2.

If the substrate 46 is a p-type substrate, an n-well may be provided at the location where the ferroelectric memory FET is to be provided. Above the n-well, a ferroelectric gate stack 32 may be provided, in any suitable way. This gate stack 32 comprises at least one ferroelectric layer 32 and a gate electrode 50. Besides the ferroelectric gate stack 32, also a select transistor gate stack may be provided. This select transistor gate stack comprises a gate dielectric 60 and a select gate electrode 85. Both the gate stack 32 and the select transistor gate stack may then be used for defining the locations of n+ implants to be performed for forming source and drain regions 41, 42, 43 so as to form, together with the select transistor gate stack and the gate stack 32, the select transistor 80 and the ferroelectric memory FET 40, respectively.

In alternative embodiments where the substrate 46 is a p-type substrate, first a replacement gate may be provided on the substrate 46. The drain and source regions may then be formed by using photolithography and implanting n+ dopants, like for example As+, in the source and drain regions aside the replacement gate, e.g. using ion beam implantation. The replacement gate may then be removed, after which an n− implant may be selectively provided in the p-type substrate under the ferroelectric stack, for example by counterdoping, where the replacement gate has been removed. Preferably providing said n-implant is performed using a relatively shallow implant similar to a threshold voltage adjust. This way, the n− implant is automatically aligned with the ferroelectric gate stack to be formed. On top of the n− implant, the ferroelectric gate stack 32 is formed, comprising at least one ferroelectric layer 31 and optionally a dielectric layer in between the n− well and the stack of ferroelectric layers 31. A gate electrode 50, for instance a metal gate electrode, is provided on top of the ferroelectric layers, using methods known in the art.

It is to be noted that since the ferroelectric memory FETs 40 are accumulation-mode devices, the channel is an n-type channel formed in the n− implant 1, resulting in two accumulation levels.

While the basic processes are described above with specific reference to the fabrication of memory devices or arrays according to the disclosed technology, there are several optional steps known to those skilled in the art that may be used. In addition, although the basic processes described above are utilized in the fabrication, those skilled in the art will recognize the order in which the basic processes are performed may be varied to achieve the desired structures.

What is claimed is:

1. A non-volatile memory cell, comprising:
   a pinch-off ferroelectric field effect transistor (FET) comprising a channel layer electrically connecting a source region and a drain region, wherein each of the channel layer, the source region and the drain region is formed of a semiconductor region doped with a first dopant type; and
   at least one select device electrically connected in series to the pinch-off ferroelectric FET.

2. The non-volatile memory cell according to claim 1, wherein the at least one select device comprises at least one select transistor.

3. The non-volatile memory cell according to claim 2, wherein the at least one select device comprises a select transistor having a channel layer formed of a semiconductor region doped with a second dopant type opposite the first dopant type, the channel layer of the select transistor electrically connecting a source region and a drain region each doped with the first dopant type, wherein the drain region of the select transistor and the source region of the pinch-off ferroelectric FET are formed of a common highly doped region.

4. The non-volatile memory cell according to claim 3, wherein the common highly doped region is electrically floating.

5. The non-volatile memory cell according to claim 3, wherein the pinch-off ferroelectric FET comprises:
   a ferroelectric gate stack comprising at least one ferroelectric layer and a gate electrode formed on the at least one ferroelectric layer;

an n-type source region and an n-type drain region; and
an n-type channel layer electrically connecting the n-type source region and the n-type drain region,
wherein the pinch-off ferroelectric FET has a negative threshold voltage, and
wherein the at least one select transistor is an n-MOS transistor.

6. The non-volatile memory cell according to claim 5, wherein each of the n-type source and drain regions of the pinch-off ferroelectric FET comprises a highly doped $n^+$ region.

7. The non-volatile memory cell according to claim 6, wherein the at least one select device comprises an n-type source region and an n-type drain region each comprising a highly doped $n^+$ region.

8. The non-volatile memory cell according to claim 7, wherein the n-type drain region of the select device serves as the n-type source region of the pinch-off ferroelectric FET.

9. The non-volatile memory cell according to claim 5, wherein the pinch-off ferroelectric FET further comprises at least one dielectric layer interposed between the at least one ferroelectric layer and the n-type channel and/or interposed between the at least one ferroelectric layer and the gate electrode.

10. The non-volatile memory cell according to claim 5, wherein the n-type channel layer is formed in in a counter-doped n-type substrate region formed in a p-type substrate.

11. The non-volatile memory cell according to claim 5, wherein the n-type channel layer is formed in an n-type region under the ferroelectric gate stack, and wherein the n-type region is formed on a p-type substrate or an insulator.

12. The non-volatile memory cell according to claim 3, wherein the at least select one select device and the pinch-off ferroelectric FET are electrically connected in series between a bit line and an array ground.

13. The non-volatile memory cell according to claim 12, wherein the pinch-off ferroelectric FET is positioned at the bit line side and the select device is positioned at the side of the array ground.

14. The non-volatile memory cell according to claim 12, wherein the pinch-off ferroelectric FET is positioned at the side of the array ground and the select device is positioned at the bit line side.

15. A non-volatile memory array, comprising a plurality of memory cells according to claim 1, logically arranged in rows and columns.

16. A method of operation of a non-volatile memory device according to claim 1, wherein data of the ferroelectric pinch-off memory gate stack in accumulation mode is read out without applying a voltage to the gate electrode of the ferroelectric pinch-off memory FET.

* * * * *

UNITED STATES PATENT AND TRADEMARK OFFICE
CERTIFICATE OF CORRECTION

PATENT NO. : 10,090,036 B2
APPLICATION NO. : 15/385593
DATED : October 2, 2018
INVENTOR(S) : Jan Van Houdt Page 1 of 1

It is certified that error appears in the above-identified patent and that said Letters Patent is hereby corrected as shown below:

In the Specification

In Column 10, Line 45, change "the a" to --the--.

In the Claims

In Column 15, Line 26, Claim 10, change "in in" to --in--.

Signed and Sealed this
Fifth Day of March, 2019

Andrei Iancu
*Director of the United States Patent and Trademark Office*